(12) United States Patent
McIntosh

(10) Patent No.: US 6,658,938 B2
(45) Date of Patent: Dec. 9, 2003

(54) ELECTRET TRANSDUCER

(76) Inventor: Robert B. McIntosh, 309 Vassar Rd., Alexandria, VA (US) 22314

( * ) Notice: Subject to any disclaimer, the term of this patent is extended or adjusted under 35 U.S.C. 154(b) by 44 days.

(21) Appl. No.: 10/091,948

(22) Filed: Mar. 6, 2002

(65) Prior Publication Data

US 2002/0124656 A1 Sep. 12, 2002

Related U.S. Application Data

(60) Continuation-in-part of application No. 09/482,119, filed on Jan. 13, 2000, now Pat. No. 6,456,477, which is a division of application No. 09/037,733, filed on Mar. 10, 1998, now Pat. No. 6,151,967.

(51) Int. Cl.$^7$ .......................... G01P 15/125; G01L 9/12
(52) U.S. Cl. ................. 73/514.32; 361/283.2; 361/283.4; 307/400
(58) Field of Search .................. 73/514.18, 514.32, 73/718, 724, 862.626; 361/278, 280, 283.1, 283.2, 283.3, 283.4; 381/191; 307/400

(56) References Cited

U.S. PATENT DOCUMENTS

| | | | | |
|---|---|---|---|---|
| 3,778,561 A | * | 12/1973 | Reedyk | 381/191 |
| 3,993,939 A | * | 11/1976 | Slavin et al. | 73/724 |
| 4,092,696 A | * | 5/1978 | Boesen et al. | 361/283.1 |
| 5,186,054 A | * | 2/1993 | Sekimura | 73/724 |

* cited by examiner

*Primary Examiner*—John E. Chapman

(57) ABSTRACT

A transducer with at least one variable-area capacitor comprising a flexible electrode with a surface facing a surface of a cooperating rigid electrode and an electret affixed to a portion of one of said surfaces, wherein said surface of said rigid electrode has a contoured region selected to increase a region of substantially fixed capacitance spacing as said flexible electrode deflects in response to an applied stress.

11 Claims, 4 Drawing Sheets

ELECTRET TRANSDUCER

CROSS-REFERENCE TO RELATED APPLICATIONS

This application is a continuation-in-part application of divisional application U.S. Ser. No. 09/482,119, filed Jan. 13, 2000, now U.S. Pat. No. 6,456,477, Divisional of application U.S. Ser. No. 09/037,733, filed Mar. 10, 1998, now U.S. Pat. No. 6,151,967, issued Nov. 28, 2000. This application references art disclosed in U.S. application Ser. No.: 09/794,198, filed Feb. 27, 2001; Ser. No. 09/816,551, filed Mar. 24, 2001; Ser. No. 09/834,691, filed Apr. 13, 2001 now U.S. Pat. No. 6,556,471; Ser. No. 09/866,351, filed May 25, 2001 now U.S. Pat. No. 6,496,348; and Ser. No. 09/954,670, filed Sept. 18, 2001; all continuation-in-part applications of divisional application U.S. Ser. No. 09/482,119. Each disclosure of the foregoing applications are expressly incorporated herein by reference. All of the applications are assigned to the same assignee as the present application.

GOVERNMENT RIGHTS

This invention was made with Government support under contract N00024-97-C-4157 from the Naval Sea Systems Command. The Government has certain rights to this invention.

FIELD OF THE INVENTION

The present invention relates capacitive transducers self-biased by a thin-film electret. More specifically, it relates to wide dynamic range force, pressure, and displacement sensors; electrostatic actuators; and acoustic and ultrasonic transceivers with multiple capacitor elements.

BACKGROUND OF THE INVENTION

Simple electrostatic transducers comprise a variable capacitor with two, substantially parallel-plate electrodes: a flexible electrode responsive to a physical effect and a rigid counter-electrode. A change in pressure or force applied to the flexible electrode causes it to deflect. Displacement of the flexible electrode is electrically sensed by detecting a change in capacitance between cooperating electrodes. When a polarization voltage $V_0$ is applied across the electrodes, the voltage $v_c(t)$ across the capacitor for a small diaphragm displacement $\delta(t)$ can be approximated by, $$v_c(t) \approx \frac{\delta(t)}{s_0} V_0 \approx \frac{\Delta C(t)}{C_0} V_0 \quad (\delta << s_0) \tag{1}$$

where $C_0$ is the quiescent capacitance and $s_0$ is the equilibrium spacing between the capacitor plates biased with a static potential $V_o$.

Conventional capacitive microphones utilize a high polarization voltage $V_0$ to transduce the amplitude of a time varying acoustic pressure $p_a(t)$ to an open circuit voltage $v_c(t)$ across the capacitor electrodes. The polarization voltage is applied across the microphone capacitor through a high-value charging resistor R that maintains a substantially constant charge $Q_o = C_0 V_0$ on the variable capacitor. The sensitivity S of a microphone in terms of its open-circuit voltage divided by the pressure amplitude of an incident acoustic wave of angular frequency w can be expressed as $$S = \frac{v_c(t)}{\Delta p(t)} = \frac{\Delta C(t) V_0}{C_0} \cdot \frac{C_0}{C_0 + C_s} \cdot \frac{j\omega R(C_0 + C_s)}{1 + j\omega R(C_0 + C_s)} \tag{2}$$

where $C_s$ is the total parasitic capacitance including the input capacitance of amplification electronics. Eq. 2 can be further refined to include additional frequency dependent factors to account for specific electrode geometry and the effective mass and compliance of the diaphragm and surrounding fluids.

Electret capacitive transducers operate without an external dc polarization voltage. A thin-film electret is affixed to or formed on one capacitor electrode. An electret has a permanent state of electrical polarization that provides an electric field to self-bias a variable capacitor. This permits small electret microphones to be manufactured in high volume for hearing aids and communications equipment by avoiding the cost and complexity of providing a low-noise source of high voltage.

Many methods are known to provide electrets and electret capacitance microphones. Four references of note are: 1) G. M. Sessler and J. E. West, "Self-Biased Condenser Microphone with High Capacitance," Acoust. Soc. of Am. J. 34: 1787–1788, 1962; 2) U.S. Pat. No. 3,740,496 of Carlson et al.; U.S. Pat. No. 5,536,982 of Mino et al.; and 4) U.S. Pat. No. 2001/0033670 A1 of Tai et al.

Prior-art electret transducers are constructed with substantially parallel-plate electrodes. The sensitivity, linearity, and dynamic range of these capacitive transducers are limited by the geometric constraints of parallel-plate construction. The capacitance-displacement sensitivity of a gap-varying capacitor at mid-range signal frequencies is substantially:

$$\Delta C/\Delta s = -\epsilon A/s^2 \tag{3}$$

The dependency on $s^2$ results in a non-linear capacitance sensitivity with plate spacing.

Other disadvantages of prior-art, variable capacitors result from the minimum spacing that can be reliably maintained between parallel spaced electrodes and associated low values of quiescent capacitance. A transducer with low quiescent capacitance has a high source impedance $1/j\omega C$ at acoustic frequencies. This generally requires the capacitor voltage $v_c(t)$ to be detected by a JFET amplifier. The noise of a FET and high value bias resistors further limit dynamic range at low frequencies. Another disadvantage of small quiescent capacitance is a loss in sensitivity S due to stray capacitance. The total parasitic capacitance $C_s$ of fringing fields, support structure, electrodes, and inputs of electronic circuitry reduces sensitivity S in Eq. 2 by the factor $C_o/(C_o + C_s)$.

The spacing between capacitor electrodes limits the maximum displacement of a movable electrode. This displacement is further restricted by the well-known "pull-in" instability occurring at a critical voltage at which the movable electrode deflects by about ⅓ of the undeflected capacitor gap. Precision capacitance accelerometers use electrostatic force-rebalanced feedback to maintain an inertial mass suspended on a flexible electrode at a substantially fixed position to minimize non-linear capacitance response. However, feedback cannot significantly increase sensitivity or avoid the disadvantages of small quiescent capacitance.

The disadvantages of capacitance transducers with parallel electrodes (with or without an electret) are avoided by the variable-area capacitor embodiments of U.S. Pat. No. 6,151,967 and U.S. patent application Ser. Nos. 09/834,691 and 09/866,351.

A variable area capacitor (VAC) is referred to herein as a variable capacitor for which a substantial portion of a change in capacitance with electrode displacement is due to an increase in effective electrode area rather than to a change in electrode spacing. The capacitance of this type of VAC increases as an area of fixed capacitive spacing increases between cooperating electrodes while the approach of a movable electrode with respect to a stationary electrode remains small. This increases the effective area A contributing the majority of the capacitance between the electrodes and accommodates large displacements not limited by the dimensions of a narrow air gap. When a rising voltage is applied to a VAC, an electrostatic force of attraction continuously collapses a flexible electrode across a curved surface of a cooperating rigid electrode.

The large changes in capacitance of an electret VAC, up to 500% and more, can be linearly transduced by circuit inventions disclosed in U.S. patent application Ser. Nos. 09/794,198 and 09/816,551. An electret VAC with a thin flexible diaphragm can be operated as an electrostatic actuator or as an acoustic transmitter. When a variable voltage is applied across a VAC, acoustic or ultrasonic energy couples to the medium in which it is immersed.

SUMMARY OF THE INVENTION

The dynamic range of electret capacitive transducers can be extended several orders of magnitude using VAC's with the general construction of the embodiments of U.S. Pat. No. 6,151,967. Electret transducers of the present invention can be constructed in part by methods disclosed in U.S. patent application Ser. No. 09/834,691. The instant invention can be advantageously applied to VAC transducers constructed to detect physical effects including force, pressure, acceleration, and displacement. VAC transducers can be operated as electrostatic actuators, with and without, force-rebalanced feedback control. All aspects of the present invention are applicable to sensors and actuators with multiple VAC elements.

Accordingly, the principle object of the present invention is to provide electret sensors and actuators with the low-noise, high capacitive sensitivity, and wide linear dynamic range characteristic of VAC transducers. This object is realized by electrically polarizing a thin dielectric film placed between a flexible electrode and a curved rigid counter-electrode. Non-limiting examples of VAC transducer embodiments in which an electret can be used to provide a self-biased transducer with a predetermined response characteristic are disclosed in U.S. Pat. No. 6,151,967 and U.S. patent application Ser. Nos. 09/834,691, 09/866,351, and 09/954,670.

More specifically, it is desirable to obtain large, linear changes of voltage $v_c(t)$ in Eq. 1 for values of $\delta \gg s_o$ to provide high values of sensitivity S, as defined by Eq. 2.

Other objects of the present invention are to:
1. Provide electret VAC transducers with a flexible electrode comprising a simple, edge-supported cantilever beam;
2. Provide electret VAC transducers with a flexible electrode comprising a diaphragm;
3. Provide electret VAC transducers with multiple sensing and actuation elements electrically connected in parallel or alternately connected individually;
4. Provide electret VAC transducers with a response characteristic governed by a predetermined surface contour of a rigid electrode, such as a contour selected to maximize linear dynamic range;
5. Provide electret VAC transducers with high values of quiescent capacitance to avoid the noise limitations of small capacitors and detection electronics and a reduction in sensitivity due to parasitic capacitance;
6. Provide electret VAC transducers that employ electrostatic force-rebalanced feedback to sense and control the displacement of an inertial mass, stylus, or optical element.
7. Provide electret actuators that provide an electrostatic force to mechanically bias a mechanical, electrical, or optical element around a desired position of static equilibrium.

In accordance with the present invention, transducers including at least one VAC sensing or actuator element is self-biased by a thin electret film. The electret provides a DC polarization voltage across a flexible electrode and a stationary electrode with a surface contoured region. An electrical signal is generated that is substantially linearly proportional to displacement of the flexible sensing electrode over a wide dynamic range.

The above and other objects and advantages of the present invention will become apparent from consideration of the following description and drawings.

DESCRIPTION OF THE DRAWINGS

The embodiments of the invention are described by way of non-limiting drawings. The drawings are schematic in nature for clarity of description and thus features shown are not drawn to relative scale; like reference numbers designate similar parts or elements with similar functions.

DETAILED DESCRIPTION

Figure 1:
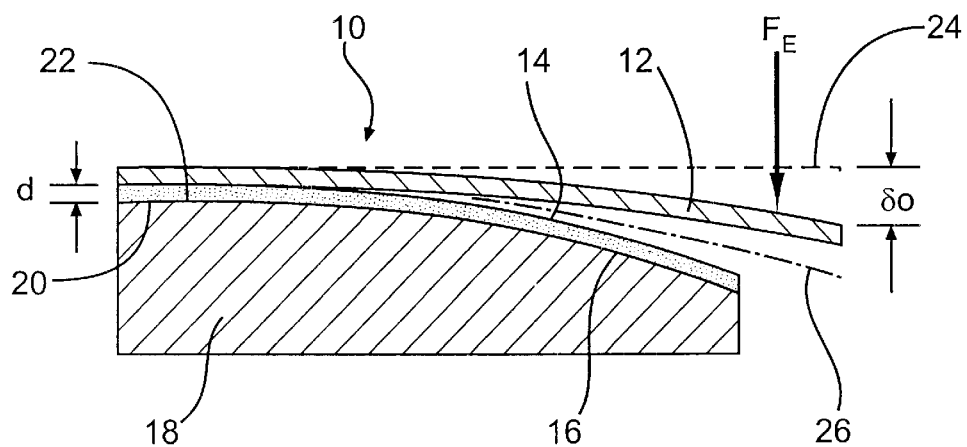
FIG. 1, is a sectional view of an electret VAC transducer with a flexible electrode comprising a cantilever beam.

FIG. 1, is a simplified sectional view of an electret VAC transducer generally shown by reference numeral 10 with a flexible electrode 12 comprising a compliant cantilever beam. A thin film electret 14 is formed over a surfaced contoured region 16 of a rigid electrode 18. An edge region 20 of flexible electrode 12 is affixed to an edge portion 22 of cooperating rigid electrode 18. Electret 14 maintains a fixed capacitance spacing d between regions of mutually opposed areas of flexible electrode 12 and cooperating rigid electrode 18. Regions of fixed capacitance spacing increase as flexible electrode 12 deflects in response to an applied stress.

The permanent electrical polarization of electret 14 provides an electric field that applies an electrostatic stress to electrode 12 shown representatively by concentrated force $F_E$. This force of attraction causes electrode 12 to deflect a distance $\delta_o$ from a position indicated by dashed line 24 to the position shown for static force equilibrium where the elastic reaction forces of the beam equal the electrostatic force $F_E$. At this balanced position, transducer 10 has a high value of quiescent capacitance $C_0$ compared to the quiescent capacitance of a gap varying capacitor of similar size with a parallel electrode spacing equal to $\delta_o$. When additional mechanical or electrostatic force is applied to electrode 12, it deflects to a new position shown representatively by dashed line 26. The curvature of contoured region 16 can be selected to govern the rate of change in capacitance of transducer 10 with deflection of electrode 12.

An electret transducer with substantially equivalent performance to transducer 10 can be provided by applying electret 14 to flexible electrode 12. For either embodiment, an affixed payload selected from the group consisting of an inertial mass, stylus, hinge, optical element, electrical element, mechanical component, and mechanical coupling can be supported or attached to electrode 12.

Figure 2:
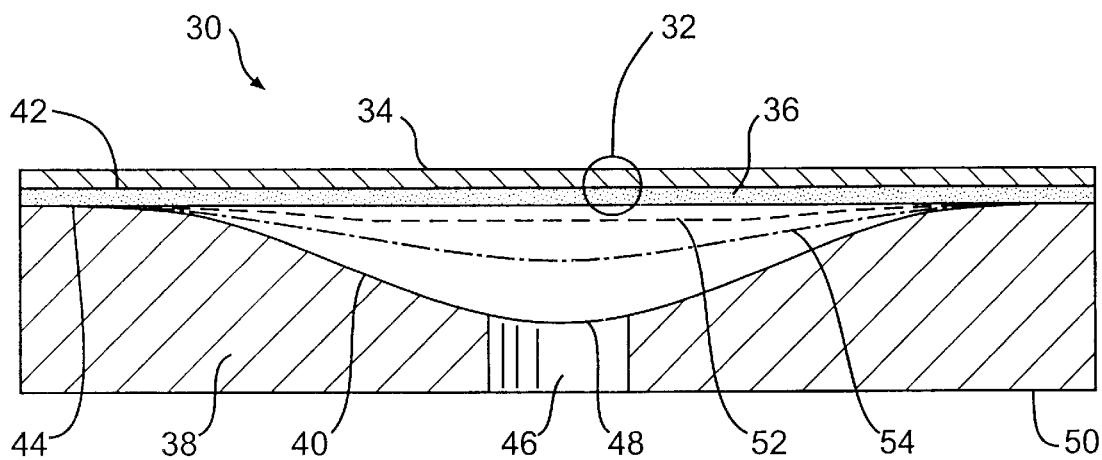
FIG. 2, is a sectional view of an electret VAC transducer with a flexible electrode comprising a diaphragm.

FIG. 2 is a simplified sectional view of an electret VAC transducer, generally identified by reference numeral 30, that can be operated for example as a self-biased pressure sensor or noise-cancelling microphone. Transducer 30 includes a flexible sensing diaphragm 32 comprising a metal film electrode 34 deposited on a thin film electret 36. A cooperating rigid electrode 38 has a radially symmetric surface contoured region 40 formed over and in a central portion of top surface 42 of rigid electrode 38. Diaphragm 32 is affixed at edge portion 44 to top surface 42. The profile of contoured region 40 is selected to provide a desired change in capacitance with deflection of diaphragm 32. A through hole 46 can be optionally used to connect a central portion 48 of contoured region 40 to a bottom surface 50 of substrate 38. Cavity 46 provides a passage for pressure equalization or a port for differential pressure sensing.

Electret 36 maintains a substantially fixed capacitive spacing between regions of mutually opposed areas of the two capacitor electrodes that increase with deflection of diaphragm 32. The electric field of electret 36 causes diaphragm 32 to deflect from its unloaded position to a position shown by dashed line 52. When additional mechanical or electrostatic force is applied to diaphragm 32, it deflects further to a new generatrix. The generatrix shown by dot-dashed line 54 is representative of the displacement of diaphragm 32 to uniform applied pressure.

Figure 3:
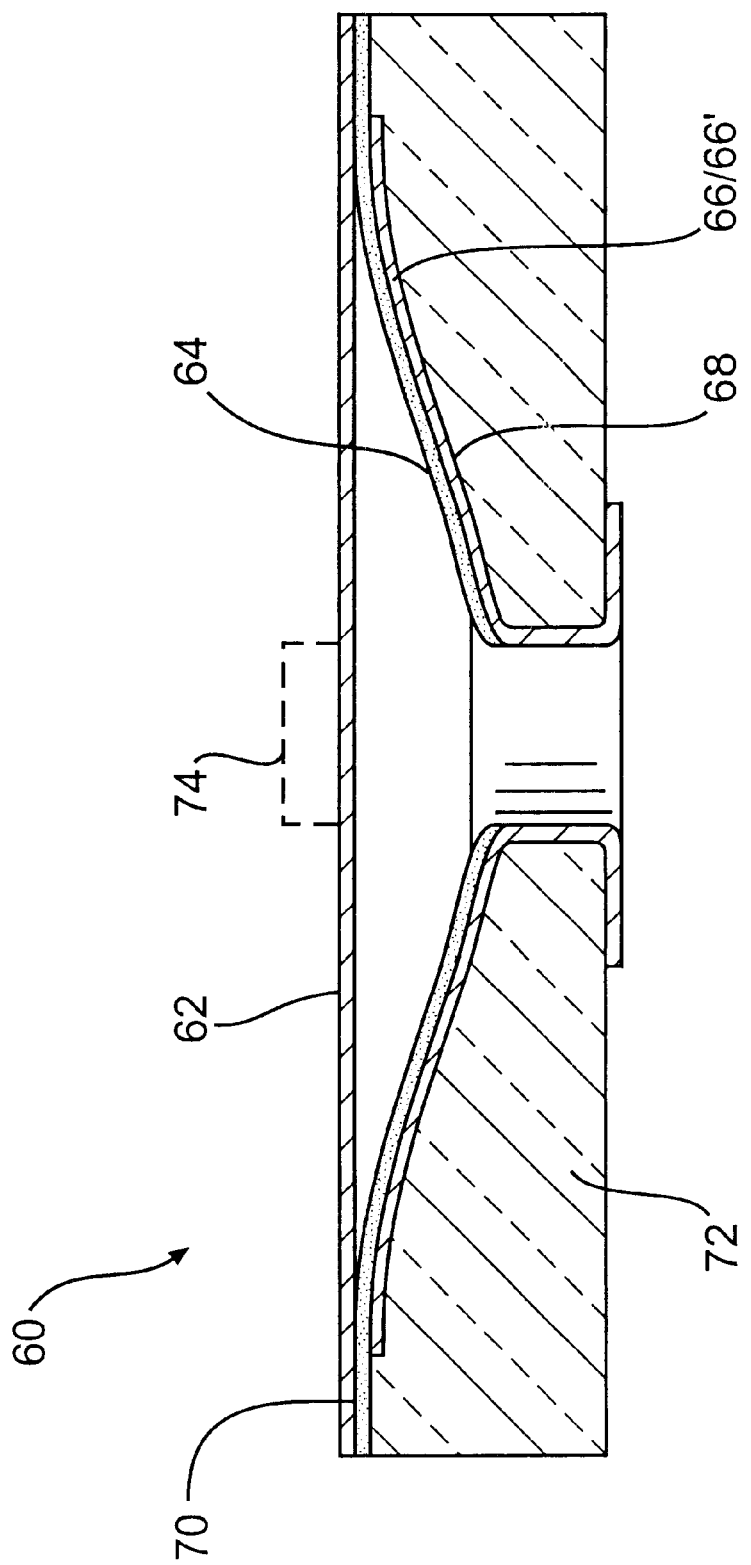
FIG. 3, is a sectional view of a VAC transducer with an electret formed over a rigid electrode.

FIG. 3 is a sectional view of an electret VAC transducer, generally identified by reference numeral 60 with a flexible electrode comprising a diaphragm 62. A thin film electret 64 is applied over a rigid electrode 66. Electrode 66 is formed by depositing a metal film 66' on a surface contoured region 68 formed over and in a portion of top surface 70 of a substrate 72. For this embodiment, diaphragm 62 can comprise a metal film, a doped or metallized crystalline film, or a metallized polymer film. If an inertial mass 74 shown by a dashed outline is affixed to diaphragm 62, transducer 60 has the construction of an electret VAC accelerometer which can be operated as a force-rebalanced accelerometer. A displacement of mass 74 due to a force of acceleration is detected by sensing a capacitance change between diaphragm 62 and rigid electrode 66. This change in capacitance can be detected to provide a feedback control voltage across the same capacitor electrodes to maintain mass 74 at a substantially fixed position by a feedback method such as the one disclosed in U.S. patent application Ser. No. 09/866,351.

Flexible electrode diaphragm 62 can be formed by evaporating or vacuum sputter depositing a thin metal film of aluminum, copper, gold, titanium, chrome, or a multiple metal film over a diaphragm of polyester, polycarbonate, polyimide, or a fluoropolymer. The diaphragm thickness can range between one to over 50 micrometers. Metallized polyester (PET) and polycarbonate diaphragms can be thermally bonded to polycarbonate or polyethylene terephthalate glycol (PETG) substrates respectively. It is desirable that diaphragm and substrate materials have closely matched coefficients of thermal expansion. Contoured region 68 can be thermally formed or coined for example by pressing a heated, single-point diamond-machined metal master into surface 70.

Electret 64 can be formed by electrically polarizing or implanting a charge in a polymer film by one of several well practiced methods used to manufacture electret microphones. The effective polarization voltage of electrets of conventional microphones ranges between 48 and 200 Volts. A lower polarization voltage, 5 to 20 Volts, can be used to deflect a flexible electrode of transducers of the present invention to a desired operating position while still providing high sensitivity compared to prior-art transducers of equivalent size. This advantage arises because of the high electric field across the small effective capacitor gap of a VAC.

For microscale transducers, diaphragm 62 can be fabricated from metallized thin films of silicon, polycrystalline silicon, silicon dioxide, silicon nitride, or silicon oxynitride. Surface contoured region 68 can be formed in glass, silicon, or crystalline substrates by methods disclosed in U.S. patent application Ser. Nos. 09/834,691 or 09/954,670.

Figure 4:
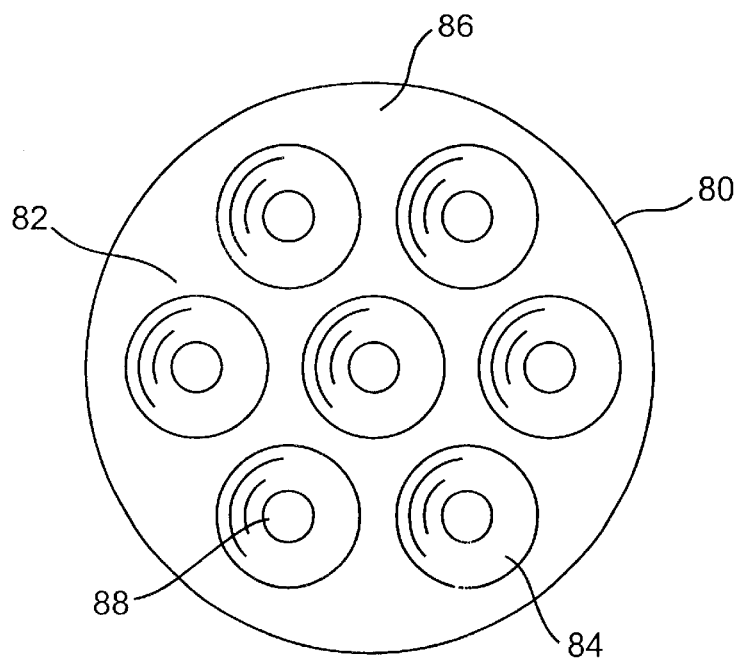
FIG. 4 is a top view of a substrate of an electret VAC transducer with an array of dish-shaped depressions.

FIG. 4 is a top view a substrate 80 of an electret VAC transducer with a surface contoured region 82 comprising an array of dish-shaped depressions 84 formed over and in a portion of top surface 86. Substrate 80 can be used to construct a capacitive transducer having multiple VAC elements. For diaphragms of equal stiffness, a transducer with multiple capacitor elements has a dynamic response that extends to higher frequencies than a transducer of comparable size with a single capacitor element. Through holes 88 at the center of each capacitor site provide a path for pressure equalization or to minimize the compliance of the fluid volume between the capacitor electrodes.

Figure 5:
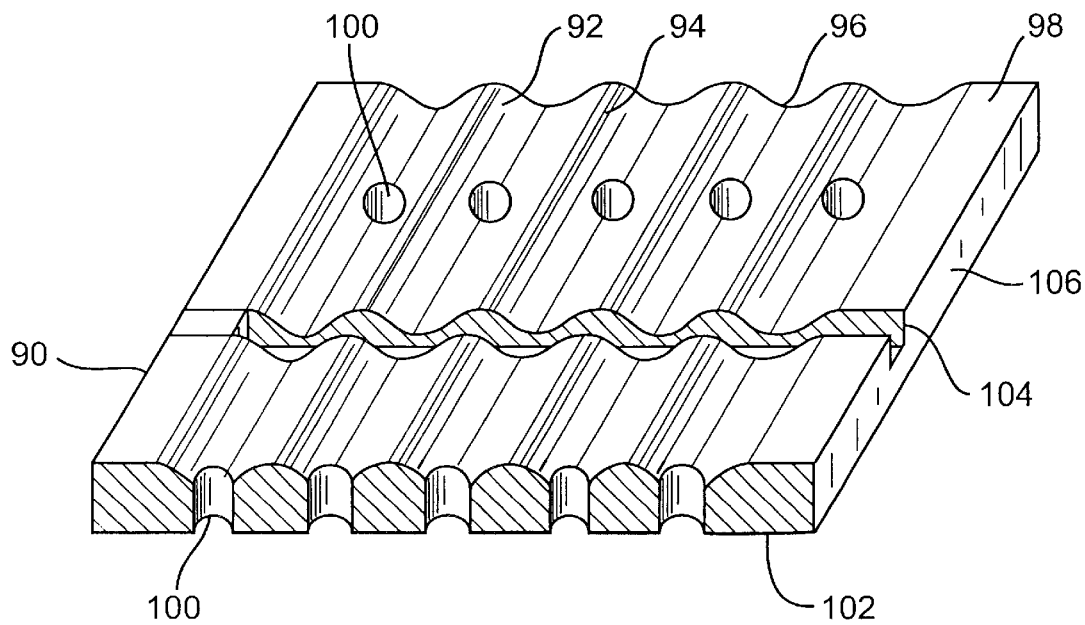
FIG. 5 is an illustration a portion of a substrate of an electret VAC transducer with multiple ridges and valleys.

FIG. 5 is an illustration of a portion of a substrate 90 of an electret VAC transducer with a surface contoured region 92 that includes a series of ridges 94 and valleys 96. Contoured region 92 is formed over and in a portion of top surface 98 of substrate 90. Through holes 100 can be optionally formed between valleys 96 and bottom surface 102. Alternately, or in addition to through holes 100, one or more channels 104 can be formed to connect valleys 96 to an edgewall 106 to increase the compliance of the air or fluid volume between the capacitor electrodes.

An advantage of using multiple ridges 94 to support a sensing diaphragm is that for a given pressure, a rectangular diaphragm element of width, a, deflects more than a circular element of diameter, a, or a square element with sides of width, a.

Figure 6:
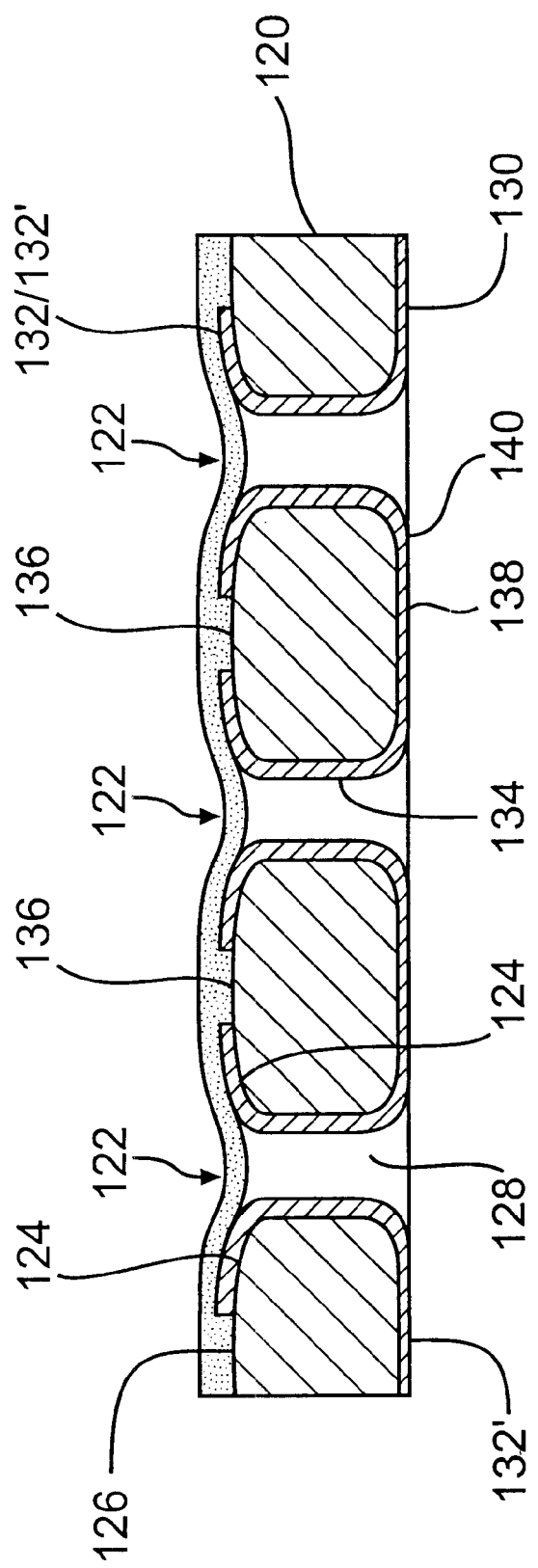
FIG. 6 is a sectional view of a substrate of a VAC transducer with an array of capacitor elements.

FIG. 6 is a sectional view of a substrate 120 of an electret transducer that includes an array of active VAC element sites 122. A surface contoured region 124 is formed over and in a top surface 126 of substrate 120. For this sectional view, contoured region 124 can include multiple dish-shaped depressions 84 of the type shown in FIG. 4 or multiple ridges 94 and valleys 96 of the type as shown in FIG. 5. Through holes 128 provide a passage between contoured region 124 and bottom surface 130. A rigid electrode 132 for each VAC element comprises a metal film 132' deposited over contoured region 124. Metal film 132' is also deposited on walls 134 of through holes 128 and on bottom surface 130. Metal film 132' can be selectively etched from surface areas 136 of top surface 126 to reduce inactive electrode area. All VAC element sites 122 are electrically connected in parallel if metal film 132' covers bottom surface 130. This allows all VAC elements to be sensed and activated as a group. Individual or subgroups of VAC elements can be sensed and actuated individually by selectively etching a portion of metal film 132' from bottom surface areas 138 to provide isolated areas 140 to bond electrical terminals.

A transducer with individually addressable capacitor elements can be used for applications such as acoustic wavefront analysis and imaging. The electret transducers of the present invention with sealed or partially sealed through holes 128 can operated as acoustic or ultrasonic transceivers by capacitively coupling an AC drive voltage across the capacitor electrodes.

The size of the through holes and channels of the transducers of the present invention can be sized to control fluid flow into and out of the internal volume of the VAC elements. For transducers with arrays of VAC elements, a plate with a matching array of apertures can be attached to the bottom of a substrate. Alternately, a plate of porous material can be used.

The specific details of the embodiments described above are not intended to limit the scope of the appended claims and their legal equivalents.

What is claimed is:

1. A transducer with at least one variable-area capacitor comprising a flexible electrode with a surface facing a surface of a cooperating rigid electrode and an electret affixed to a portion of one of said surfaces, wherein said surface of said rigid electrode has a contoured region selected to increase a region of substantially fixed capacitance spacing as said flexible electrode deflects in response to an applied stress.

2. The transducer of claim 1 wherein said flexible electrode comprises a cantilever beam.

3. The transducer of claim 1, wherein said flexible electrode comprises a diaphragm.

4. The transducer of claim 1 wherein a payload is affixed to said flexible electrode.

5. The transducer of claim 1 wherein said contoured region of said rigid electrode comprises an array of depressions.

6. The transducer of claim 1 wherein said contoured region of said rigid electrode comprises multiple valleys.

7. The transducer of claim 1 wherein said payload is an inertial mass.

8. A variable-area capacitor with cooperating electrodes and an electret affixed to a portion of one of said cooperating electrodes, said cooperating electrodes comprising a flexible electrode and a rigid electrode with a surface contoured region facing a principal surface of said flexible electrode.

9. The capacitor of claim 8 wherein said flexible electrode comprises a cantilever beam.

10. The capacitor of claim 8 wherein said flexible electrode comprises a diaphragm.

11. The capacitor of claim 8 wherein a payload is affixed to said flexible electrode.

* * * * *